United States Patent

Hedeen et al.

Patent Number: 6,157,276
Date of Patent: *Dec. 5, 2000

[54] MRI MAGNET ASSEMBLY WITH NON-CONDUCTIVE INNER WALL

[75] Inventors: Robert Arvin Hedeen, Clifton Park; William Alan Edelstein; Sayed-Amr El-Hamamsy, both of Schenectady; Kenneth Gordon Herd, Niskayuna; Robert Adolph Ackermann, Schenectady, all of N.Y.

[73] Assignee: General Electric Company, Schenectady, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 09/134,764

[22] Filed: Aug. 14, 1998

[51] Int. Cl.[7] .................................................. H01F 6/00
[52] U.S. Cl. ........................ 335/216; 324/318; 62/51.1; 505/879; 505/893; 505/898
[58] Field of Search ...................................... 335/216, 296; 324/318, 319, 320; 62/51.1; 505/879, 892, 893, 898

[56] References Cited

U.S. PATENT DOCUMENTS

| | | | |
|---|---|---|---|
| 4,492,090 | 1/1985 | Laskaris | 62/55 |
| 4,642,569 | 2/1987 | Hayes et al. | 324/318 |
| 4,771,256 | 9/1988 | Laskaris et al. | 335/301 |
| 4,879,515 | 11/1989 | Roemer et al. | 324/318 |
| 4,896,128 | 1/1990 | Wollan et al. | 335/299 |
| 4,910,462 | 3/1990 | Roemer et al. | 324/318 |
| 4,986,078 | 1/1991 | Laskaris | 62/51.1 |
| 5,001,447 | 3/1991 | Jayakumar | 335/299 |
| 5,034,713 | 7/1991 | Herd et al. | 335/216 |
| 5,278,502 | 1/1994 | Laskaris et al. | 324/318 |
| 5,489,848 | 2/1996 | Furukawa | 324/318 |
| 5,530,413 | 6/1996 | Minas et al. | 335/216 |
| 5,635,839 | 6/1997 | Srivastava et al. | 324/320 |

*Primary Examiner*—Ray Barrera
*Attorney, Agent, or Firm*—Marvin Snyder; Douglas E. Stoner

[57] ABSTRACT

An MR magnet assembly includes a cylindrical vessel for housing a superconducting magnet and having a vacuum between its inner and outer walls. The vessel defines a magnet bore for receiving a patient to be imaged. A gradient coil assembly is mounted in the bore adjacent the inner wall of the magnet assembly. To reduce gradient coil noise, the inner wall is constructed of a non-conductive material which does not support eddy currents.

5 Claims, 3 Drawing Sheets

MRI MAGNET ASSEMBLY WITH NON-CONDUCTIVE INNER WALL

BACKGROUND OF THE INVENTION

This invention relates generally to a magnetic resonance imaging (MRI) scanner and, more particularly, to a low-noise subassembly for an MRI scanner.

When a substance such as human tissue is subjected to a uniform magnetic field (polarizing field $B_0$) in a z direction, the individual magnetic moments of the nuclear spins in the tissue, in attempting to align with this polarizing field, precess about it at their characteristic Larmor frequency. If the tissue is subjected to a magnetic field (excitation field $B_1$) which is in the x-y plane and which is near the Larmor frequency, the net aligned moment $M_z$ may be rotated, or "tipped", into the x-y plane to produce a net transverse magnetic moment $M_t$. A signal is emitted by the excited spins and, after the excitation field $B_1$ is terminated, this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received nuclear magnetic resonance (NMR) signals is digitized and processed to reconstruct the image using one of many well known reconstruction techniques.

The magnets used to produce the polarizing field in MRI scanners include superconductive coil magnets, resistive-coil magnets, and permanent magnets. Known superconductive magnets include liquid-helium cooled and cryocooler-cooled superconductive magnets. Typically, for a helium-cooled magnet, the superconductive coil assembly includes a superconductive main coil which is at least partially immersed in liquid helium contained in a dewar surrounded by a dual shield situated within a vacuum enclosure. In a conventional cryocooler-cooled magnet, the superconductive main coil is surrounded by a thermal shield situated within a vacuum enclosure, and the cryocooler coldhead is externally mounted to the vacuum enclosure with the first stage of the coldhead in thermal contact with the thermal shield and the second stage of the coldhead in thermal contact with the superconductive main coil. Nb—Ti superconductive coils typically operate at a temperature of generally 4° Kelvin, and Nb—Sn superconductive coils typically operate at a temperature of generally 10° Kelvin. The vacuum in the vacuum enclosure must be at very low pressure to prevent unwanted heat transfer which can result in magnet "quenching" (i.e., loss of superconductivity).

Known superconductive magnet designs include closed magnets and open magnets. Closed magnets typically comprise a single, tubular-shaped superconductive coil assembly having a bore. The superconductive coil assembly includes several radially-aligned and longitudinally spaced-apart superconductive main coils each carrying a large, identical electric current in the same direction. The superconductive main coils are typically designed to create a polarizing magnetic field of high uniformity within a spherical imaging volume centered at the bore of the magnet where the object to be imaged is placed.

Open magnets typically employ two spaced-apart toroidally-shaped superconductive coil assemblies with the space between the assemblies allowing for access by medical personnel to perform surgery or other medical procedures during MRI imaging. The patient may be positioned in that space and also in the bore of the two spaced-apart coil assemblies. The open space helps the patient overcome feelings of claustrophobia that may be experienced in a closed magnet design.

The imaging gradient fields are produced by a gradient coil assembly positioned between the main, polarizing field coils and the patient. Because the imaging gradient fields are applied as a series of pulses, the gradient coil assemblies of MRI scanners generate loud noises which many medical patients find objectionable. Active noise control techniques have been used to reduce gradient coil assembly noise, including noise-canceling patient earphones. Known passive noise control techniques include locating the gradient coil assembly in the same vacuum enclosure that contains the superconductive main coils.

As disclosed in co-pending U.S. patent application Ser. No. 08/696,077, filed on Aug. 13, 1996, entitled "Low Noise MRI Scanner", and assigned to the instant assignee, vibration isolation mounts may be used to support the MRI gradient coil assembly in a space between the polarizing field magnet and the patient. This space may also be sealed and evacuated. The vibration isolation mounts inhibit transmission of sound from the gradient coils through the supporting structure, and the vacuum impedes transmission of sound through air to the surrounding structures. While these measures are very effective in reducing the level of noise reaching the patent, further reductions are desired.

SUMMARY OF THE INVENTION

One mechanism by which the active gradient coils produce noise involves eddy currents which are induced in the inner wall of the superconductive coil assembly and interact with the polarizing magnetic field to produce Lorentz forces on the elements of the superconductive coil assembly, causing these elements to vibrate and produce noise. This noise mechanism is defeated according to the present invention by replacing the inner wall of the magnet assembly with an inner wall formed of a non-conductive material that will not support eddy currents.

Another aspect of the invention is the construction of a non-conductive inner wall for a magnet assembly which is strong enough to withstand both the axial forces produced by the magnet and the forces produced by the vacuum in the magnet enclosure, and which is impermeable to water vapor. The inner wall is formed as a cylindrically shaped inner layer made of an electrically insulating material, a vapor barrier layer formed by wrapping a thin ribbon of non-magnetic metal around the inner layer, and an outer layer made of an electrically insulating material. An insulating layer is disposed on one side of the ribbon. The insulating material contact between successive turns of the foil prevents the metal vapor barrier from supporting eddy currents. The outer layer is made thick enough to increase the inner wall strength to a level sufficient to withstand the axial forces produced by the main magnet and the forces produced by the vacuum in the magnet enclosure.

DESCRIPTION OF THE PREFERRED EMBODIMENTS

Figure 1:
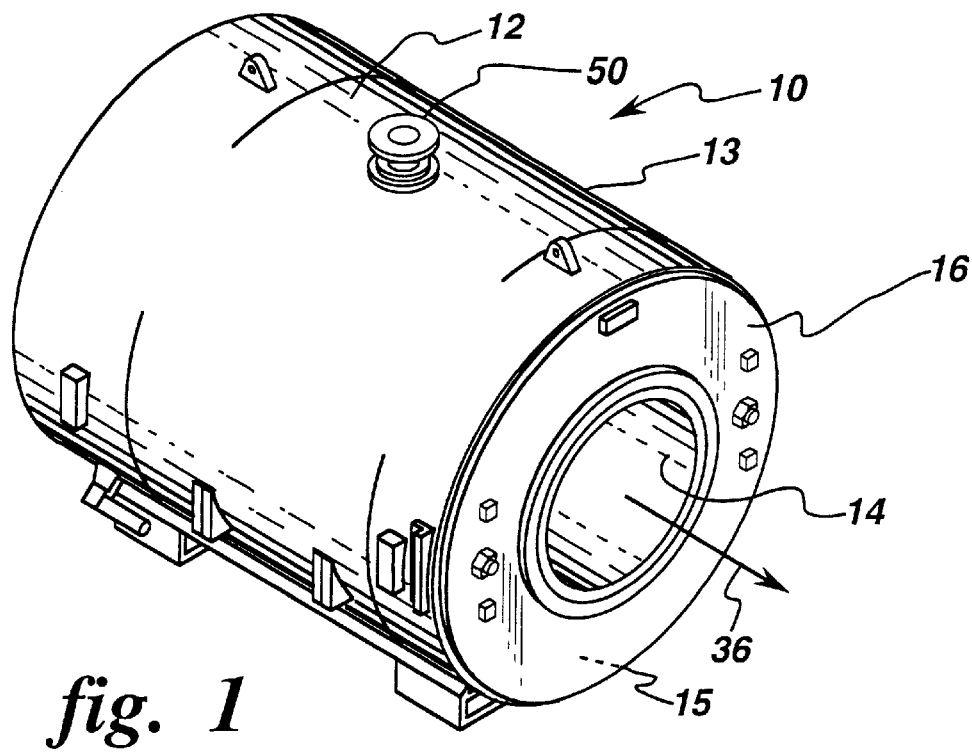
FIG. 1 is a perspective view of a magnet assembly employing the present invention.

FIG. 1 illustrates an MR magnet assembly 10 including a vacuum vessel cylinder 12, a cylindrical outer wall 13, annular end plates 16 extending redially inward from outer wall 13, and a cylindrical inner wall 14 centered around a bore axis 36. Vacuum cylinder 12 and end plates 16 are formed of a ferromagnetic material, such as mild rolled steel plate for shielded magnets or a non-magnetic material such as aluminum or stainless steel for unshielded magnets. Inner wall 14 is formed of a non-magnetic and non-conductive material. These elements are fastened together to form a vacuum-tight annular chamber 15. For shielded magnets, end plates 16 fit tightly against vacuum vessel cylinder 12 to conduct magnetic flux therebetween and to reduce the magnetic field radiated outside of the magnet, as is generally known in the art. Inner wall 14 enables the magnetic field to penetrate the magnet bore where a patient is situated during NMR scanning. Magnet assembly 10 must provide a high strength and homogeneous magnetic field within this bore of the magnet.

Figure 2:
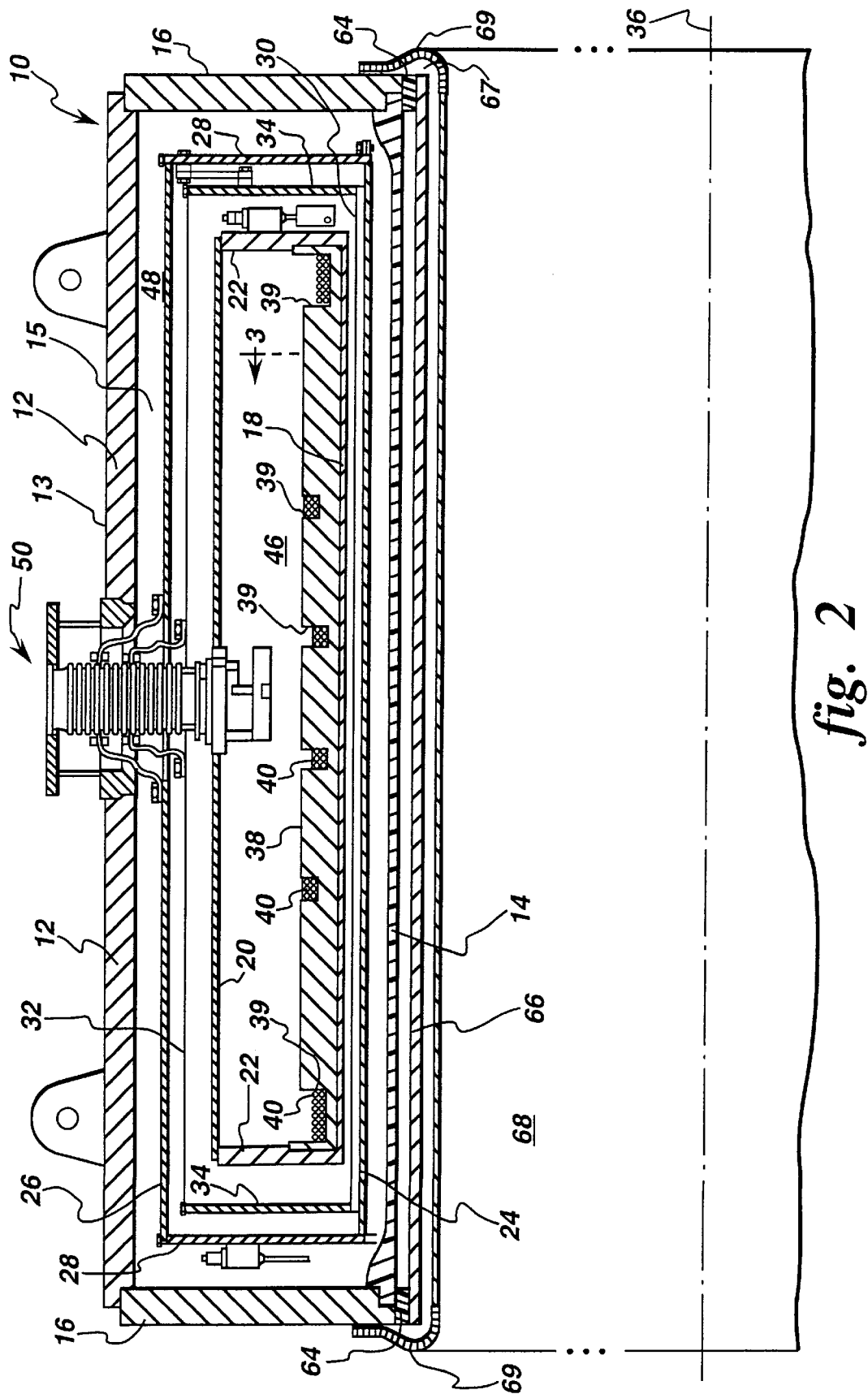
FIG. 2 is a partial view in cross section through the magnet assembly of FIG. 1 with a gradient coil assembly in place.

As shown in FIG. 2, vacuum tight annular chamber 15 encloses a first heat shield comprised of cylindrical, concentric outer and inner walls 26 and 24, respectively, disposed about bore axis 36. The spaces between the ends of the outer wall 26 and inner wall 24 are closed by end plates 28.

A second heat shield, comprised of cylindrical, concentric outer and inner walls 32 and 30, respectively, disposed about bore axis 36, is enclosed within the first heat shield. The spaces between the ends of outer wall 32 and inner wall 30 are closed by end plates 34.

Within the space enclosed by outer wall 32 and inner wall 30 of the second heat shield is a liquid helium vessel also comprised of cylindrical concentric outer and inner walls 20 and 18, respectively, which similarly are co-axial with bore axis 36. The spaces between the ends of outer wall 20 and inner wall 18 are closed by end plates 22. The first and second heat shields and helium vessel are constructed of non-magnetic material, such as aluminum.

Within the space contained by the helium vessel is a cylindrical coil form 38, which is also co-axial with bore axis 36 and holds a series of magnet coils 40 spaced apart along bore axis 36. Coils 40 are positioned coaxially with bore axis 36 and are symmetrically paired about a center point along the bore axis. During operation of magnet 10, the liquid helium vessel is filled with liquid helium 46 so as to cool magnet coils 40 to a superconducting state. The magnetic field generated by coils 40 causes the coils to repel or attract each other and therefore coils 40 must be restrained against axial movement by a series of retention surfaces 39 which ring the circumference of coil form 38. Retention surfaces 39 also serve to accurately position magnet coils 40 with respect to each other.

Figure 3:
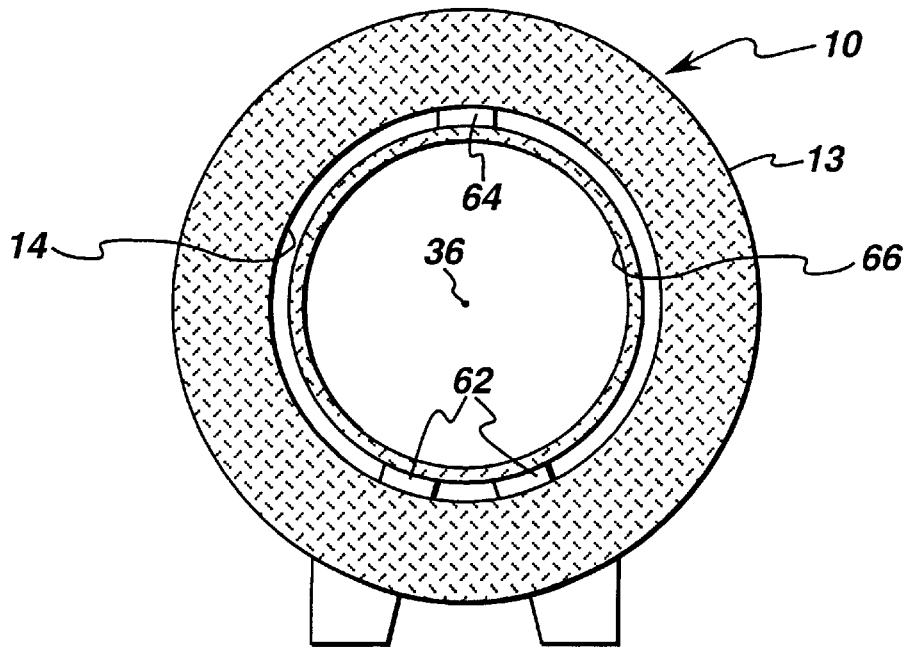
FIG. 3 is a schematic illustration of the magnet assembly FIG. 1 with a gradient coil assembly in place.

In FIG. 3, a gradient coil assembly 66 is shown mounted in the bore of magnet assembly 10, concentric about bore axis 36. Gradient coil assembly 66 is retained in position, for example, by a set of four lower isolation mounts 62 (only two of which are visible in the illustration) that bear the weight of assembly 66 and a pair of upper isolation mounts 64 (only one of which is visible in the illustration) that apply a downward compressive force to restrict vertical movement of gradient coil assembly 66. Isolation mounts 62 and 64 include rubber isolators with a stiffness selected such that the mechanical resonant frequency of the entire gradient coil assembly 60 is below the frequency range of the gradient pulses used in the imaging pulse sequence. Typically, this resonance frequency is in the range of 5 to 30 Hz. Isolation mounts 62 and 64 may be placed within the bore, as shown in FIG. 2, or brackets (not shown) may be fastened to each end of magnet assembly 10 and gradient coil assembly 66 to provide rigid support for isolation mounts 62 and 64.

As shown in FIGS. 2 and 3, gradient coil assembly 66 is concentric with, and in close proximity to, inner wall 14 of magnet assembly 10. A set of gradient coils, such as those disclosed in U.S. Pat. No. 4,737,716 and assigned to the instant assignee, are formed on assembly 66.

Figure 5:
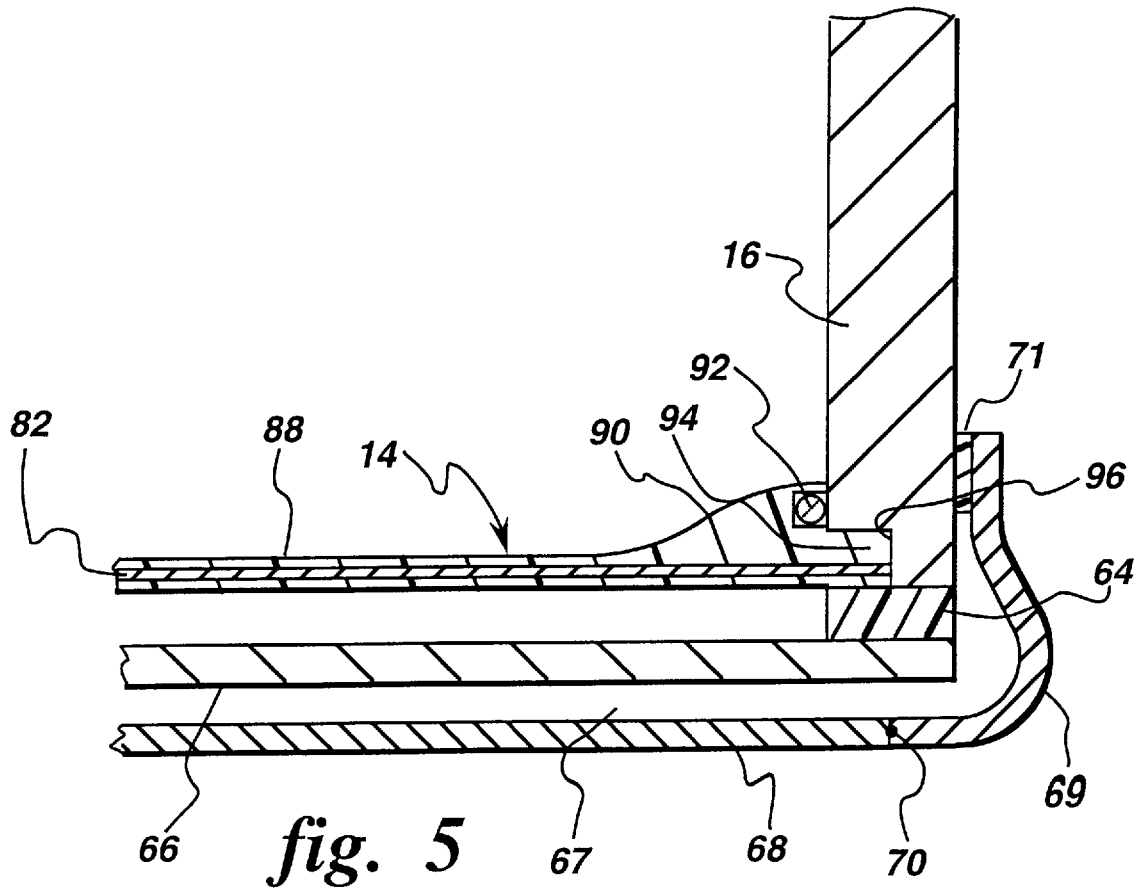
FIG. 5 is a partial view in cross section showing attachment of the non-conducting inner wall to the magnet assembly of FIG. 1.

FIGS. 2 and 5 show gradient coil assembly 66 enclosed in an annular chamber 67 defined by a patient bore wall 68 and a pair of end bells 69. These elements are constructed of non-conductive material and define the bore of the system in which a patient being imaged is situated. End bells 69 are attached to the respective ends of cylindrical patient bore wall 68 and a rubber o-ring 70 provides a seal at each of these connections. End bells 69 wrap around the ends of gradient coil assembly 66 and extend radially outward to fasten to the face of respective end plates 16. A gasket 71 provides a seal between each end bell 69 and the end plate 16 to which it fastens, and annular chamber 67 is evacuated to reduce gradient coil sound emission reaching the patient as described in the above-cited co-pending U.S. patent application.

Although gradient coils 66 are designed to direct their magnetic field radially inward toward the bore of the magnet, a magnetic field is nevertheless produced in the surrounding region. This surrounding magnetic field produces eddy currents in the conductive elements of magnet assembly 10 and sets them into vibration. By constructing inner wall 14 of magnet assembly 10 with non-conducting materials, eddy currents cannot be induced therein and it does not vibrate or produce noise.

Figure 4:
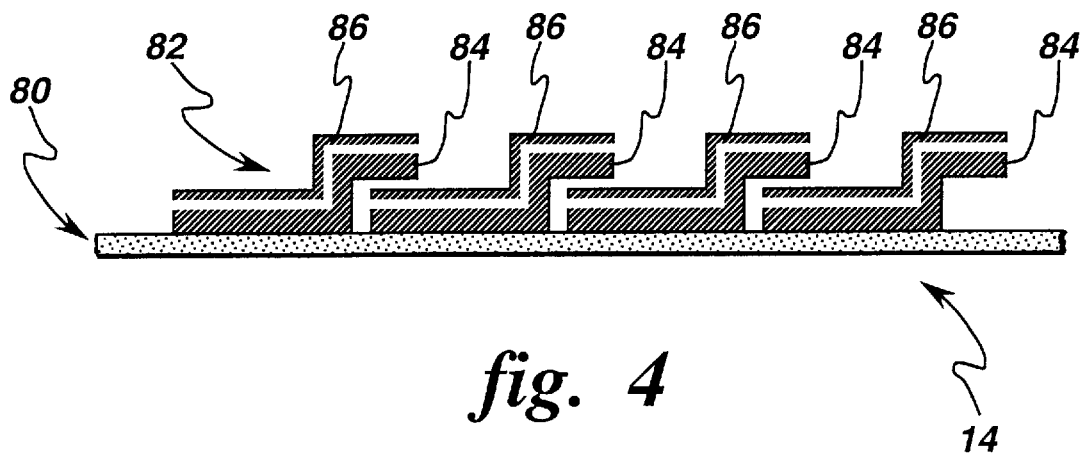
FIG. 4 illustrates a cross section of the non-conducting inner wall which forms a part of the magnet assembly of FIG. 1.

FIGS. 4 and 5 show non-conductive inner wall 14 formed as the result of wet winding glass cloth and glass roving around a cylindrical mandrel (not shown). A first insulating layer 80 is formed by wet winding of 0.003 inch thick glass cloth and epoxy around the mandrel four times. The first, or inner, insulating layer 80 is thus 0.012 inches thick. A commercially available e-glass is used and a two-part epoxy commercially available as Epon 826 resin and shell Linride 6k hardener from Lindau Chemicals is employed throughout.

The next step is to form a vapor barrier 82 which prevents diffusion of water vapor into the cryostat. This is accomplished by co-winding, for example, a two inch wide ribbon of 0.001 inch thick stainless steel foil 84 and 0.003 inch thick glass cloth 86 using the epoxy identified above. An overlap of approximately 1.0 inches is formed with successive wraps, and the overlapping stainless steel foil 84 provides a water vapor barrier. Glass cloth layer 86 provides electrical insulation between overlapping wraps of foil 84 to eliminate formation of eddy currents along the axial direction of the inner wall 14.

A second insulating layer 88 is wrapped over vapor barrier 82. Layer 88 is formed by wet wrapping glass roving and the above-identified epoxy until the total thickness of wall 14 is 0.135 inches. A glass roving such as 675 yield 346AA-675 commercially available from Owens Corning may be employed. This provides the strength needed to resist the axial forces produced in magnet assembly 10.

As shown best in FIG. 5, each end of non-conductive inner tube 14 is built up to form end flanges 90. This is accomplished by wrapping additional layers of the roving and epoxy composite. The ends of flanges 90 are machined to form a recess that receives a rubber O-ring 92 which is compressed against end plate 16. A ring 94 is also machined in the end of the flanges 90 and this mates with a groove 96 formed around end plate 16 to provide a secure joint. Non-conductive inner wall 14 searingly fastens end plates 16 to maintain the vacuum in the vessel 12.

While only certain preferred features of the invention have been illustrated and described, many modifications and changes will occur to those skilled in the art. It is, therefore, to be understood that the appended claims are intended to cover all such modifications and changes as fall within the true spirit of the invention.

What is claimed is:

1. A magnet assembly for an MRI system, comprising;

a vessel cylinder having an outer wall and a bore axis;

a pair annular-shaped end plates fastened to respective ends of the vessel cylinder outer wall and extending radially inward therefrom;

a cylindrical-shaped inner wall fastened to the end plates and centered around the bore axis radially inward of the vessel cylinder outer wall, the inner wall being comprised of an epoxy and glass composite material which forms a vacuum vessel with the vessel cylinder outer wall and the end plates, and including a vapor barrier said vapor barrier comprising a first non-conductive layer, and a ribbon comprised of a metal foil layer and a non-conductive material wrapped around said first non-conductive layer such that the metal foil layers on successive wraps overlap; and a cylindrical-shaped gradient coil assembly mounted within the bore of said magnet assembly and positioned radially inward of, and adjacent to, the inner wall.

2. The magnet assembly of claim 1 wherein the non-conductive material comprises an epoxy and glass composite.

3. The magnet assembly of claim 1 including a second non-conductive layer formed around the vapor barrier.

4. The magnet assembly of claim 3 wherein the first and second non-conductive layers are formed of a wrapped epoxy and glass composite material.

5. The magnet assembly of claim 1 wherein the non-conductive material is situated between overlapping wraps of said metal foil layer to provide electrical insulation therebetween.

* * * * *